United States Patent
Mikami et al.

(10) Patent No.: US 6,628,230 B2
(45) Date of Patent: Sep. 30, 2003

(54) RADIO FREQUENCY MODULE, COMMUNICATION DEVICE, AND RADAR DEVICE

(75) Inventors: Shigeyuki Mikami, Sagamihara (JP); Tetsuya Kouchi, Sagamihara (JP); Hiroyasu Matsuzaki, Yokohama (JP); Kazutaka Mukaiyama, Sagamihara (JP); Koichi Sakamoto, Yokohama (JP); Toshiro Hiratsuka, Tokyo-to (JP); Takatoshi Kato, Mino (JP); Yohei Ishikawa, Yokohama (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 10/246,701

(22) Filed: Sep. 19, 2002

(65) Prior Publication Data

US 2003/0085836 A1 May 8, 2003

(30) Foreign Application Priority Data

Sep. 19, 2001 (JP) ......................................... 2001-285557

(51) Int. Cl.$^7$ ................................................. G01S 7/28
(52) U.S. Cl. .................. 342/175; 342/70; 343/700 MS; 343/771
(58) Field of Search ............................ 342/175, 70, 71, 342/72; 343/700 MS, 771; 331/107 DP, 107 D; 333/137, 212

(56) References Cited

U.S. PATENT DOCUMENTS

| | | | | |
|---|---|---|---|---|
| 5,903,239 A | * | 5/1999 | Takahashi et al. | ... 343/700 MS |
| 5,943,005 A | * | 8/1999 | Tanizaki et al. | ............ 342/175 |
| 5,986,527 A | * | 11/1999 | Ishikawa et al. | ............ 333/239 |
| 6,008,755 A | * | 12/1999 | Ishikawa et al. | ............ 342/175 |
| 6,445,255 B1 | * | 9/2002 | Ishikawa et al. | ...... 331/107 DP |
| 2003/0085836 A1 | * | 5/2003 | Mikami et al. | ............. 342/175 |

OTHER PUBLICATIONS

"Microstrip antennas on synthesized low dieletric–constant substrates", Gauthier, G.P.; Courtay, A.; Rebeiz, G.M.; Antennas and Propagation, IEEE Transactions on, vol.: 45 Issue: 8, Aug. 1997 pp. 1310–1314.*

* cited by examiner

Primary Examiner—John B. Sotomayor
(74) Attorney, Agent, or Firm—Dickstein, Shapiro, Morin & Oshinsky, LLP.

(57) ABSTRACT

A radio frequency module includes a multi-chip substrate divided into separate substrates. An antenna block, a duplexer block, a transmitter block, a receiver block, and an oscillator block are formed on the separate substrates. Connection resonators, which are connected to transmission lines, are formed at edges of the separate substrates. The connection resonators on adjacent ones of the separate substrates are arranged close to each other such that the two adjacent resonators are electromagnetically coupled to each other. Thus, the transmission lines on the separate substrates are interconnected, and a signal can be propagated among the blocks.

15 Claims, 8 Drawing Sheets

RADIO FREQUENCY MODULE, COMMUNICATION DEVICE, AND RADAR DEVICE

BACKGROUND OF THE INVENTION

1. Field of the Invention

The present invention relates to radio frequency modules (RF modules) for transmitting and receiving electromagnetic waves at radio frequencies, such as microwaves and millimeter-waves, to communication devices, and to radar devices.

2. Description of the Related Art

Generally, known RF modules for use in communication devices and radar devices include a transmission line such as a microstrip line and electronic components including an MMIC (Microwave Monolithic Integrated Circuit) and a filter on one substrate. The electronic components are connected to the transmission line using wire bonding or ribbon bonding. Such known RF modules include an oscillation circuit for oscillating an RF signal by an electronic component, a transmitter circuit for outputting a transmission signal generated by modulating the signal generated by the oscillation circuit, and a receiver circuit for demodulating a reception signal received from an antenna. In addition to these circuits, an antenna duplexer and the antenna are externally mounted.

In the above-described known RF modules, for example, the oscillation circuit, the transmitter circuit, and the receiver circuit are integrated on one substrate formed of a resin material. It is thus necessary to optically design the overall circuit in order to reduce noise. If it is necessary to modify the design of part of the RF module, such as the oscillation circuit, the entire RF module needs to be re-designed and manufactured. Not only does the RF module have poor design performance and productivity, but it is also difficult to determine the defective portion when a defective product is detected during RF module inspection.

In known RF modules, the antenna duplexer and the antenna are externally mounted and connected to each other by wire boding. Environmental changes may cause stress on the wire bonding, and the wire may be easily broken or the connection characteristics may easily change. Hence, the reliability of the RF module is low. A large transmission loss and a large return loss are caused between the RF module and the antenna duplexer, and hence the connectivity is poor.

The RF module needs to supply a large amount of transmission power to the antenna. This increases the power consumption and noise, and hence the performance of the RF module is deteriorated. Since the antenna is externally mounted, the overall device including the RF module and the antenna tends to increase in size.

SUMMARY OF THE INVENTION

Accordingly, it is an object of the present invention to provide an RF module which can be designed and manufactured separately in units of functional blocks and which is highly reliable, a communication device incorporating the RF module, and a radar device incorporating the RF module.

In order to achieve the foregoing objects, an RF module is provided including a dielectric substrate; a plurality of functional blocks provided on the dielectric substrate; and transmission lines interconnecting the functional blocks.

The dielectric substrate is formed by combining separate substrates generated by dividing the dielectric substrate into units of functional blocks. The transmission lines formed on adjacent ones of the separate substrates are electrically coupled with each other without being in contact with each other.

With this arrangement, the RF module can be designed and manufactured in units of functional blocks, and the design performance and the productivity can be improved. Since the RF module can be inspected in units of functional blocks, a defective portion (functional block) can be easily determined and exchanged. Compared with a known RF module in which transmission lines are interconnected using wire bonding, the corresponding transmission lines formed on the separate substrates are electrically coupled to each other without being in contact with each other. Thus, the stable connection characteristics can be achieved, and the reliability can be improved.

Non-contact electrical coupling means that, not only are adjacent separate substrates disconnected from each other, but also adjacent transmission lines formed on the separate substrates are not in contact with each other by wire or ribbon. Thus, a signal (RF signal) propagating through the transmission lines electromagnetically interconnects the separate substrates and is propagated.

Resonators connected to the transmission lines may be provided at edges of the separate substrates, and the resonators provided on adjacent ones of the separate substrates may be arranged close to each other and thus electromagnetically coupled to each other.

Since the resonators formed on adjacent ones of the separate substrates are electromagnetically coupled to each other, through these resonators the transmission lines can be electrically coupled to each other while not in contact with each other. Since the resonators are disposed close to each other and directly coupled to each other, the resonators can be firmly coupled to each other. Thus, low insertion loss characteristics can be achieved over a wide range of frequencies.

The plurality of functional blocks may include an antenna block for transmitting or receiving a signal; a duplexer block connected to the antenna block; a transmitter block, which is connected to the duplexer block, for outputting a transmission signal to the antenna block; a receiver block, which is connected to the duplexer block, for receiving a reception signal received by the antenna block; and an oscillator block, which is connected to the transmitter block and the receiver block, for oscillating a signal at a predetermined frequency.

Accordingly, the RF module can be re-designed and manufactured in units of functional blocks, namely, the antenna block, the duplexer block, the transmitter block, the receiver block, and the oscillator block. Since the antenna block for transmitting or receiving a signal can be included in the dielectric substrate of the RF module, the overall size of the RF module can be reduced.

The antenna block may include a parasitic antenna on a package covering the antenna block. Accordingly, the directivity and the radiation characteristics (radiation pattern) of the antenna can be adjusted using the parasitic antenna. By changing the form, size, and location of the parasitic antenna, characteristics, including the directivity, corresponding to various system specifications can be achieved. Thus, various required specifications can be satisfied.

The plurality of separate substrates may be formed by using at least two types of dielectric materials. Accordingly, the separate substrates can be formed using dielectric materials suited for the individual functional blocks. Thus, various characteristics in accordance with the individual functional blocks can be improved, and the individual functional blocks can be optimized. Also, the freedom in design can be increased.

An electromagnetic-wave absorber or a metal shielding member for preventing unwanted coupling may be provided between two adjacent ones of the separate substrates. Accordingly, unwanted coupling between adjacent separate substrates can be prevented, and noise can be reduced. In other words, unwanted waves between adjacent separate substrates are prevented from coupling with each other, and isolation can be improved. Power loss due to unwanted waves can be suppressed, and higher efficiency can be achieved.

The separate substrates may be contained in a resin package generated by metalizing a resin material. Accordingly, the surface of the metalized resin package can provide electrostatic shielding between the separate substrates and the outside, and hence external noise interference can be prevented. Compared with a case in which a metal package is used, the manufacturing cost and the weight of the overall device can be reduced.

According to other aspects of the present invention, a communication device and a radar device are provided, each including an RF module according to the present invention.

DESCRIPTION OF THE PREFERRED EMBODIMENTS

Figure 1:
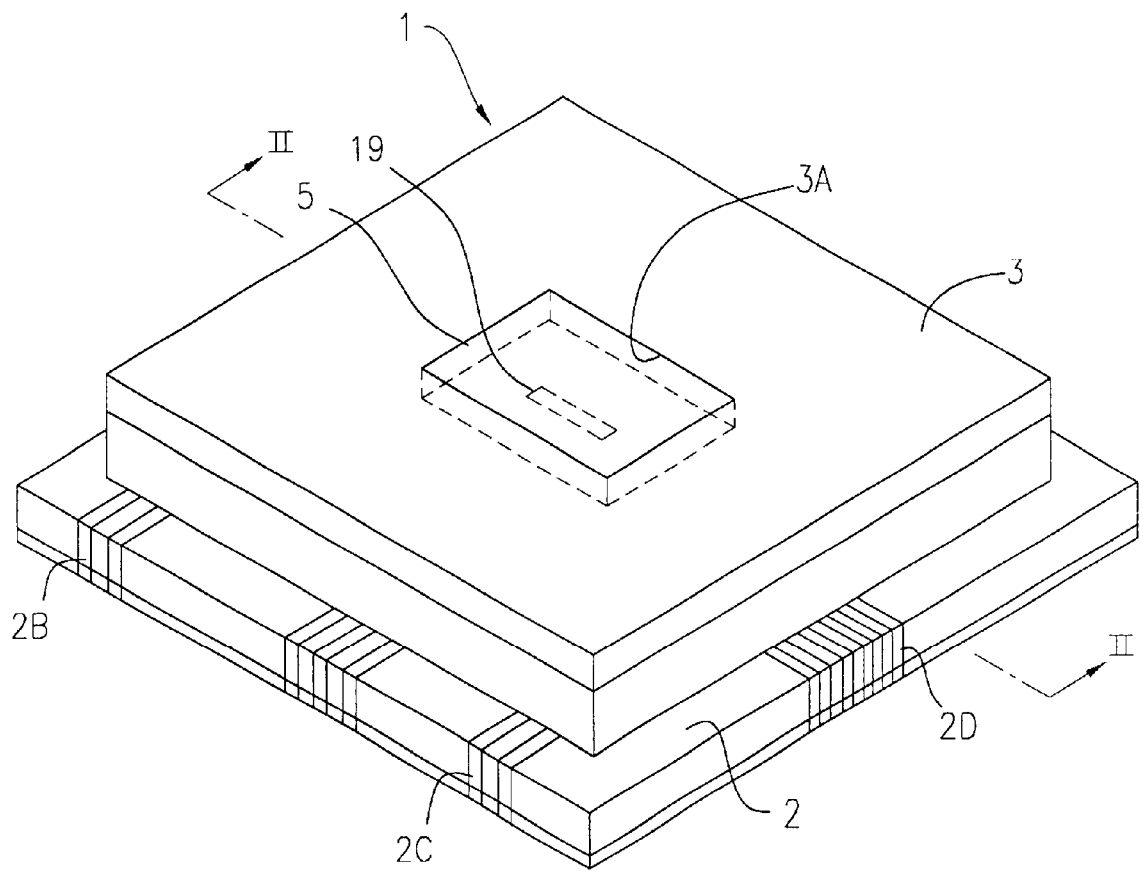
FIG. 1 is a perspective view of a communication device according to a first embodiment of the present invention.
Figure 2:
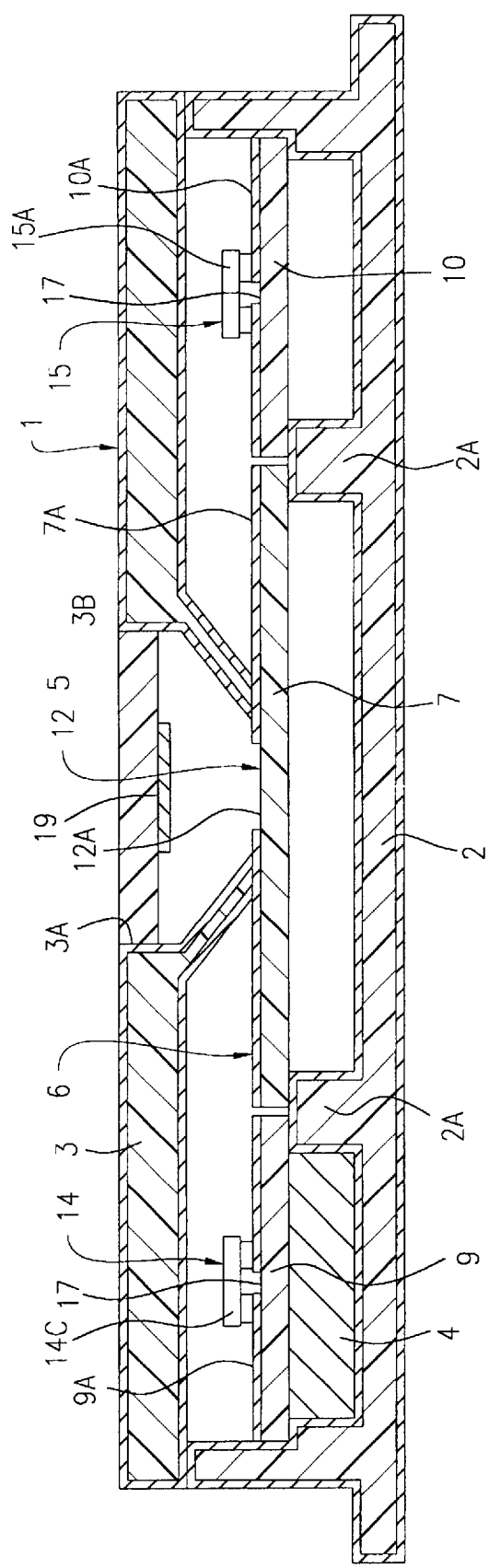
FIG. 2 is an enlarged sectional view, taken along the line II—II in FIG. 1, of the communication device.
Figure 3:
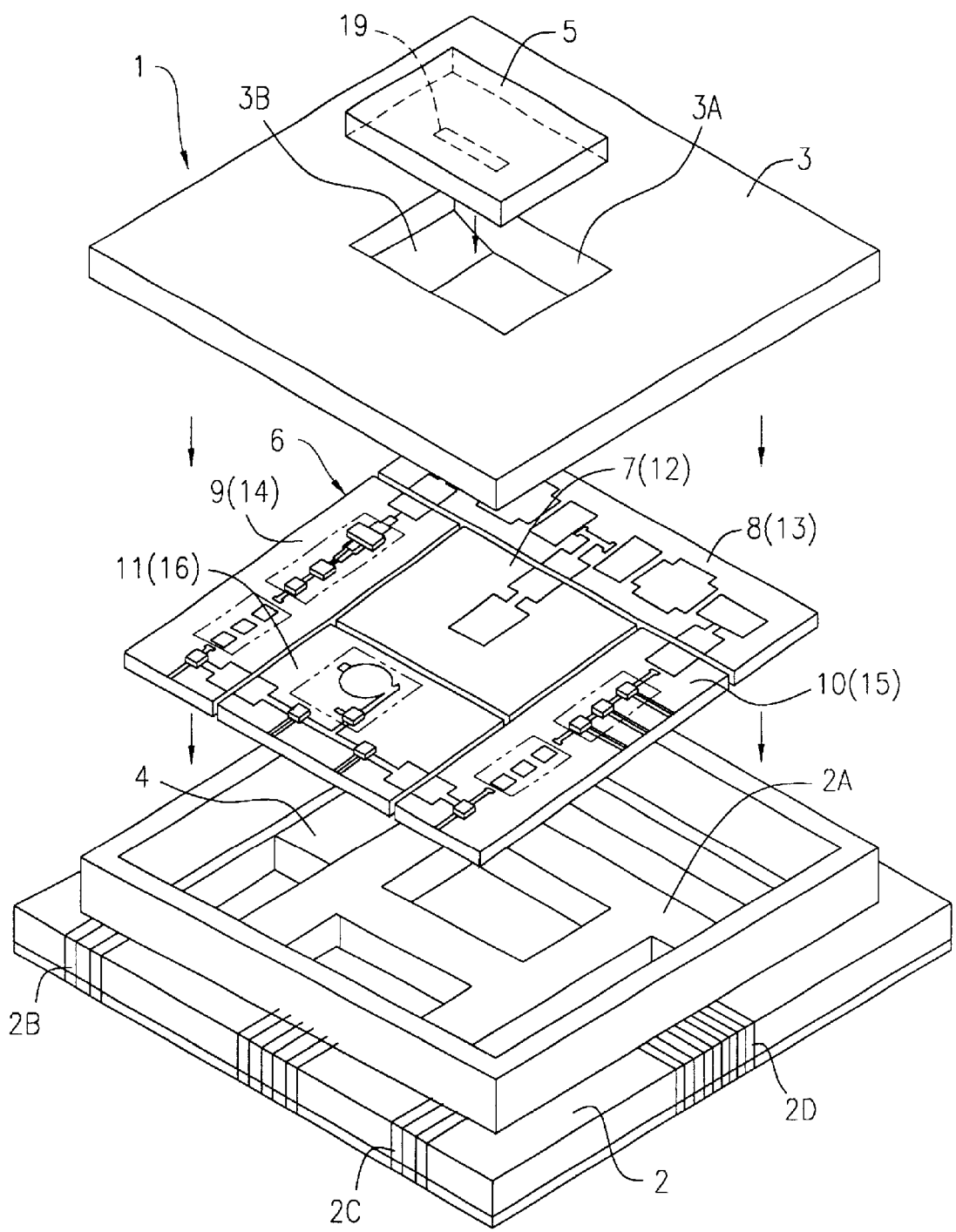
FIG. 3 is an exploded perspective view of the communication device shown in FIG. 1.
Figure 4:
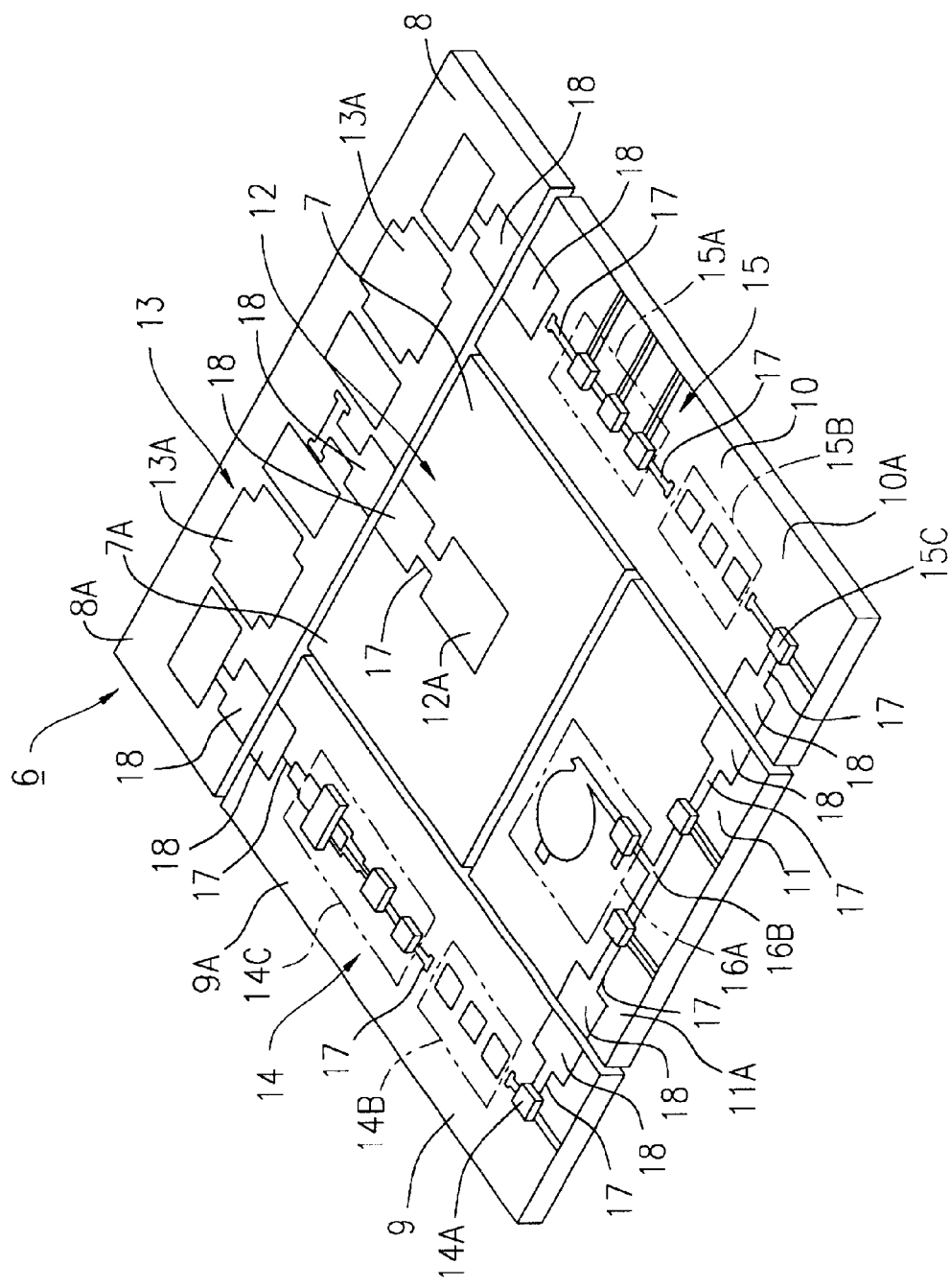
FIG. 4 is a perspective view of a multi-chip substrate shown in FIG. 3.
Figure 5:
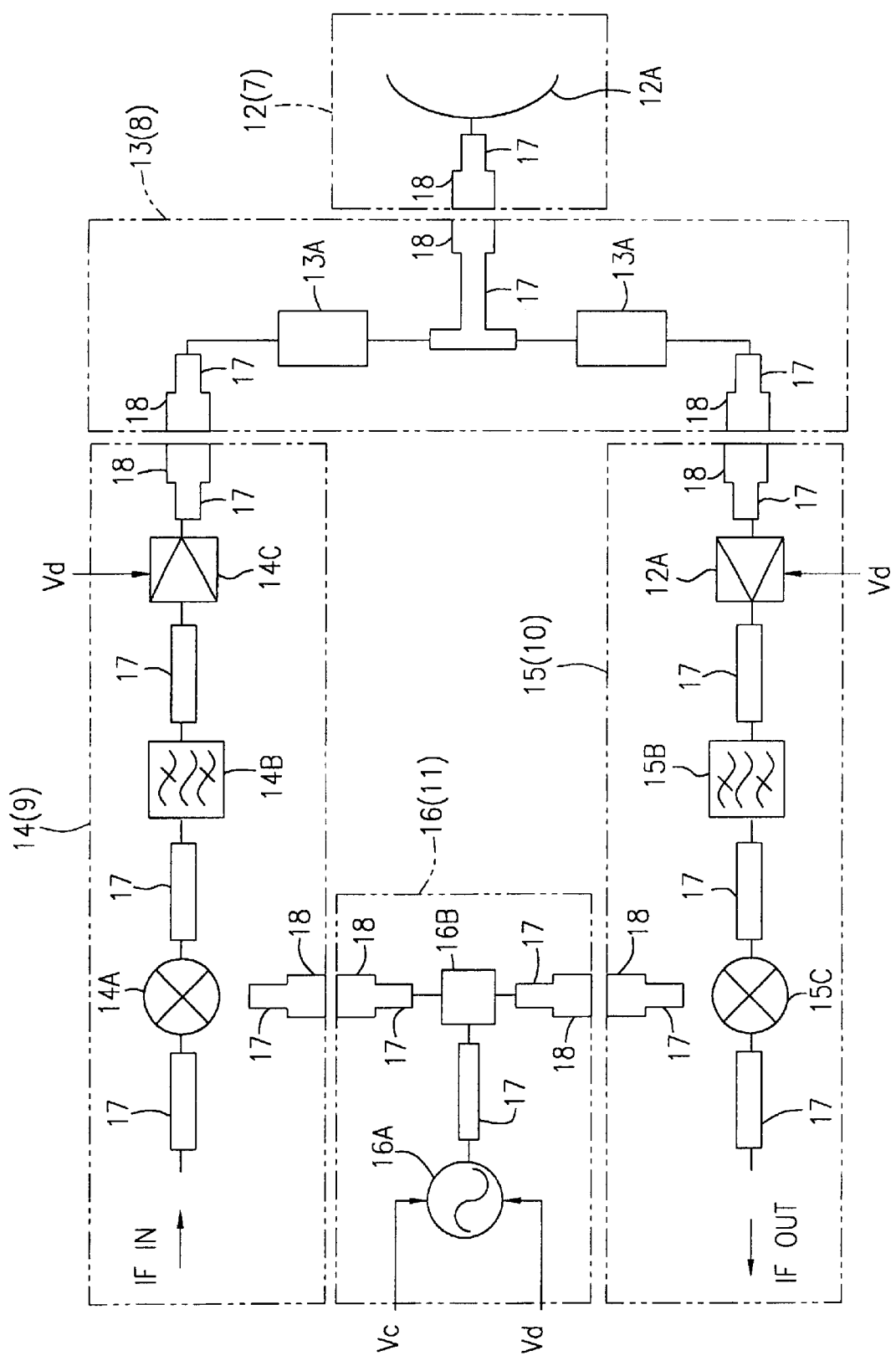
FIG. 5 is a block diagram of the overall configuration of the communication device according to the first embodiment of the present invention.

An RF module according to embodiments of the present invention will now be described with reference to the accompanying drawings.

FIGS. 1 to 5 show a communication device to which an RF module according to a first embodiment of the present invention is applied. In FIGS. 1 to 5, a resin package 1 defines the outer shape of the communication device and is metalized with a conductive metallic material. The resin package 1 preferably includes a box-shaped casing 2 having an open top face and a substantially quadrangular cover 3 for covering the open face of the casing 2.

In the interior of the casing 2, a frame-shaped base 2A for supporting a multi-chip substrate 6 (described below) is provided. The base 2A protrudes from the bottom face of the casing 2 to the middle position in the height direction. A cooling heatsink 4 is mounted in a gap of the base 2A at a position corresponding to a transmitter block 14 (described below).

At the periphery of the casing 2, input terminals 2B for receiving an intermediate frequency signal IF, output terminals 2C for outputting the intermediate frequency signal IF, and electrodes 2D for receiving a bias voltage Vd are provided.

The cover 3 functions as a package for covering an antenna block 12 (described below). The cover 3 preferably includes a substantially quadrangular aperture 3A at the center thereof and a tapered portion 3B gradually tapering from the aperture 3A to the central portion of the multi-chip substrate 6. In the aperture 3A, a blocking plate 5 through which electromagnetic waves can be transmitted is provided. The blocking plate 5 preferably has a parasitic antenna 19 (described below).

The multi-chip substrate 6, which is contained in the casing 2, functions as a dielectric substrate. The multi-chip substrate 6 is preferably formed by, for example, five separate substrates 7 to 11 formed of a dielectric material and has a substantially rectangular flat shape.

The separate substrates 7 to 11 are formed by dividing the multi-chip substrate 6. The surfaces of the separate substrates 7 to 11 are covered with conductive films 7A to 11A, respectively. The separate substrates 7 to 11 include, as functional blocks, the antenna block 12, a duplexer block 13, a transmitter block 14, a receiver block 15, and an oscillator block 16, respectively (all of which will be described below).

These separate substrates 7 to 11 are disposed so that edges (side faces) thereof are parallel to one another. There are slight gaps between the adjacent edges, and the adjacent separate substrates are not in contact with each other.

Alternatively, the separate substrates 7 to 11 can be located by connecting their edges to one another. The separate substrates 7 to 11 can also be located by fixing the separate substrates 7 to 11 onto the base 2A of the casing 2.

The antenna block 12 for transmitting and receiving electromagnetic waves is formed on the separate substrate 7, which is preferably disposed in the central portion of the multi-chip 6. The antenna block 12 is formed by a radiating slot 12A preferably forming a quadrangular aperture in the central portion of the conductive film 7A. The radiating slot 12A is connected to the duplexer block 13 by transmission line 17 and connection resonator 18 (described below).

The separate substrate 7 having the antenna block 12 is preferably formed by using a material having a lower dielectric constant compared with the other separate substrates 8 to 11 in order to improve the radiating efficiency of the radiating slot 12A. The other separate substrates 8 to 11 are preferably formed by using a material having a high dielectric constant in order to enclose signals in the interior of the substrates.

The duplexer block 13 connected to the antenna block 12 functions as an antenna duplexer. The duplexer block 13 is provided on the separate substrate 8 adjacent to an end of the separate substrate 7 and is preferably formed by resonators 13A having quadrangular apertures, which are formed on the conductive film 8A. The resonators 13A are connected to the antenna block 12, the transmitter block 14, and the receiver block 15 by transmission lines 17 and connection resonators 18 (described below).

The transmitter block 14 is connected to the duplexer block 13 and outputs a transmission signal to the antenna block 12. The transmitter block 14 is provided on the separate substrate 9, which is located on the left of the separate substrate 7 and which is adjacent to the separate substrate 8. The transmitter block 14 includes a mixer 14A, a band pass filter 14B, and a power amplifier 14C. The mixer 14A is formed by an electronic component such as a field effect transistor. The mixer 14A mixes an intermediate frequency signal IF with a carrier output from the oscillator block 16 and upconverts the signal to the transmission signal. The band pass filter 14B eliminates noise from the transmission signal from the mixer 14A. The power amplifier 14C is formed using an electronic component activated by the bias voltage Vd and amplifies the power of the transmission signal.

Since the power amplifier 14C easily generates heat, the separate substrate 9 on which the transmitter block 14 is provided is preferably formed using a material with excellent heat dissipation characteristics compared with the other separate substrates 7, 8, 10, and 11.

The mixer 14A, the band pass filter 14B, and the power amplifier 14C are connected to one another by transmission lines 17 (described below). The mixer 14A is connected to the oscillator block 16 by transmission lines 17 and connection resonators 18. The power amplifier 14C is connected to the duplexer block 13 by transmission lines 17 and connection resonators 18.

The receiver block 15 is connected to the duplexer block 13 and receives a reception signal received by the antenna block 12. The receiver block 15 mixes the reception signal and a carrier output from the oscillator block 16 and downconverts the signal to an intermediate frequency signal IF. The receiver block 15 is provided on the separate substrate 10, which is located on the right of the separate substrate 7 and which is adjacent to the separate substrate 8. The receiver block 15 includes a low noise amplifier 15A, a band pass filter 15B, and a mixer 15C. The low noise amplifier 15A is formed using an electronic component activated by the bias voltage Vd and amplifies the reception signal with low noise. The band pass filter 15B eliminates noise from the reception signal from the low noise amplifier 15A. The mixer 15C mixes the carrier output from the oscillator block 16 and the reception signal output from the band pass filter 15B and downconverts the signal to an intermediate frequency signal IF.

The low noise amplifier 15A, the band pass filter 15B, and the mixer 15C are connected to one another by transmission lines 17 (described below). The low noise amplifier 15A is connected to the duplexer block 13 by transmission lines 17 and connection resonators 18. The mixer 15C is connected to the resonator block 16 by transmission lines 17 and connection resonators 18.

The oscillator block 16 is connected to the transmitter block 14 and the receiver block 15 and oscillates a signal at a predetermined frequency, such as an RF (microwave or millimeter-wave) signal. The oscillator block 16 is formed on the separate substrate 11, which is located in front of the separate substrate 7 and which is held between the separate substrates 9 and 10. The oscillator block 16 includes a voltage controlled oscillator 16A and a branching circuit 16B. The voltage controlled oscillator 16A is formed using an electronic component activated by the bias voltage Vd and oscillates a signal at a frequency in accordance with a control signal Vc. The branching circuit 16B supplies a signal generated by the voltage controlled oscillator 16A to the transmitter block 14 and the receiver block 15.

The separate substrate 11 having the oscillator block 16 is formed using a material for compensating for temperature characteristics of the voltage controlled oscillator 16A, that is, for example, a material having temperature characteristics opposite to those of the voltage controlled oscillator 16A in order to stabilize the oscillation frequency of the signal relative to temperature change.

The voltage controlled oscillator 16A and the branching circuit 16B are connected to each other by a transmission line 17 (described below). The branching circuit 16B is connected to the transmitter block 14 and the receiver block 15 by transmission lines 17 and connection resonators 18.

The transmission lines 17 are slot-type transmission lines formed on each of the separate substrates 7 to 11. The transmission lines 17 are formed by strip notches formed on the conductive films 7A to 11A and transmit RF signals in the length direction.

The connection resonators 18 on two adjacent substrates of the separate substrates 7 to 11 are provided to electrically couple the transmission lines 17 with each other without requiring the transmission lines 17 to be in contact with other. The connection resonators 18 are located between two of the transmission lines 17 and are preferably formed at edges (near edges) of the separate substrates 7 to 11. The connection resonators 18 are each formed by making a substantially quadrangular notch in each of the conductive films 7A to 11A toward the edge. The connection resonators 18 are formed on two adjacent substrates of the separate substrates 7 to 11. Two of the connection resonators 18 are disposed close to each other, and hence these two connection resonators 18 are directly and electromagnetically coupled to each other.

A signal (RF signal) received from the antenna block 12 is supplied through the transmission line 17 to the connection resonator 18 on the separate substrate 7. At this time, the connection resonators 18 formed on the separate substrates 7 and 8 are electromagnetically coupled to each other since the connection resonators 18 are located close to each other. Thus, the signal supplied to the connection resonator 18 electromagnetically interconnects the separate substrates 7 and 8 and is supplied to the transmission line 17 on the duplexer block 13. The manner in which the transmission lines 17 are connected to each other by the connection resonators 18 in the separate substrates 8 and 9, the separate substrates 8 and 10, the separate substrates 9 and 11, and the separate substrates 10 and 11 is similar.

The parasitic antenna 19 is mounted on the blocking plate 5 of the cover 3 for covering the antenna block 12. The parasitic antenna 19 faces the radiating slot 12A of the antenna block 12 and is provided on the back of the blocking plate 5, which is disposed in the direction in which the transmission signal and the reception signal are radiated. For example, the parasitic antenna 19 is formed by a rectangular strip of conductive film. The parasitic antenna 19 is not DC-coupled to the blocks 12 to 16. By appropriately setting the position, size, and form of the parasitic antenna 19, the directivity and the radiation characteristics (radiation pattern) of the radiating slot 12A can be adjusted.

The communication device of the first embodiment is arranged as described above. The operation of the communication device will now be described.

When performing transmission using the communication device, a signal at a predetermined frequency as a carrier is input from the oscillator block 16 to the transmitter block 14. Also, an intermediate frequency signal IF is input to the transmitter block 14. The transmitter block 14 mixes the carrier from the oscillator block 16 and the intermediate frequency signal IF, upconverts the signal, and outputs the upconverted transmission signal through the duplexer block 13 to the antenna block 12. As a result, the antenna block 12 radiates the RF transmission signal through the radiating slot 12A, and the parasitic antenna 19 adjusts the radiation pattern of the transmission signal and outputs the transmission signal through the aperture 3A of the cover 3.

When performing reception using the communication device, a reception signal received by the antenna block 12 is input through the duplexer block 13 to the receiver block 15. At the same time, a signal at a predetermined frequency is input as a carrier from the oscillator block 16 to the receiver block 15. The receiver block 15 mixes the carrier from the oscillator block 16 and the reception signal and downconverts the signal to an intermediate frequency signal IF.

In the first embodiment, the multi-chip substrate 6 is formed by combining the separate substrates 7 to 11, which are formed by dividing a single substrate, for the blocks 12 to 16. The transmission lines 17 formed on the multi-chip substrate 6 are provided to cause two adjacent substrates of the separate substrates 7 to 11 to be electrically coupled to each other using the connection resonators 18 while the transmission lines 17 are not in contact with each other. Thus, the blocks 12 to 16 can be individually designed and manufactured. Various system specifications can be realized by modifying the design of only the necessary ones of the blocks 12 to 16, and hence the required specifications can be satisfied.

As a result, compared with a case in which all functional blocks are formed on one dielectric substrate, the design performance and the productivity can be improved. Since the blocks 12 to 16 can be individually inspected, a defective portion (block) can be easily determined and exchanged.

The transmission lines 17 are electrically coupled to each other while not in contact with each other by disposing the adjacent connection resonators 18 on the separate substrates 7 to 11 close to each other. Compared with a known communication device in which transmission lines are interconnected using wire bonding, environmental changes will not break the transmission lines 17, and stable connection characteristics can be achieved. Thus, the reliability can be improved.

Since two adjacent ones of the connection resonators 18 formed on the separate substrates 7 to 11 are arranged close to each another, the connection resonators 18 can be firmly coupled to each other, and low insertion loss characteristics can be achieved over a wide range of frequencies.

Since the connection resonators 18 have a shape which widens toward the edges, the area of portions of two adjacent connection resonators 18 facing each other can be increased. Thus, the degree of coupling can be increased.

As a plurality of functional blocks, the antenna block 12, the duplexer block 13, the transmitter block 14, the receiver block 15, and the oscillator block 16 are provided. The separate substrates 7 to 11 are generated by dividing the multi-chip substrate 6 into these functional block units. Thus, the functional blocks can be individually re-designed and manufactured. Since the antenna block 12 is included in the multi-chip substrate 6, the overall device can be miniaturized.

Since the parasitic antenna 19 is mounted on the blocking plate 5 of the cover 3 for covering the antenna block 12, the directivity and radiation characteristics of the antenna can be adjusted using the parasitic antenna 19. By changing the form, size, and location of the parasitic antenna 19, characteristics, including the directivity, corresponding to various system specifications can be achieved. Thus, various required specifications can be satisfied.

Since different types of dielectric materials can be used for each of the separate substrates 7 to 11, the separate substrates 7 to 11 can each be formed of dielectric materials suited for the individual blocks 12 to 16. Compared with a case in which one dielectric material is used to produce all the separate substrates 7 to 11, the freedom in design can be increased. Also, individual characteristics (high radiation effects, low noise, low loss, heat dissipation characteristics, and stable oscillation frequency) of the blocks 12 to 16 can be improved.

The separate substrates 7 to 11 are contained in the resin package 1, which is metalized with a resin material. The surface of the resin package 1 can provide electrostatic shielding between the separate substrates 7 to 11 and the outside, and hence external noise interference can be prevented. Since the resin package 1 is used, the manufacturing cost and the weight of the overall device can be reduced compared with a case in which a metal package is used.

In the first embodiment, a case in which the separate substrates 7, 9, and 11 are formed using dielectric materials suited for the antenna block 12, the transmitter block 14, and the oscillator block 16 has been described. However, it is not necessary for all the separate substrates 7 to 11 to be formed of different types of dielectric materials in accordance with the blocks 12 to 16. For example, only the separate substrate 7, having the antenna block 12, can be formed of a dielectric material differing from those of the other separate substrates 8 to 11.

Figure 6:
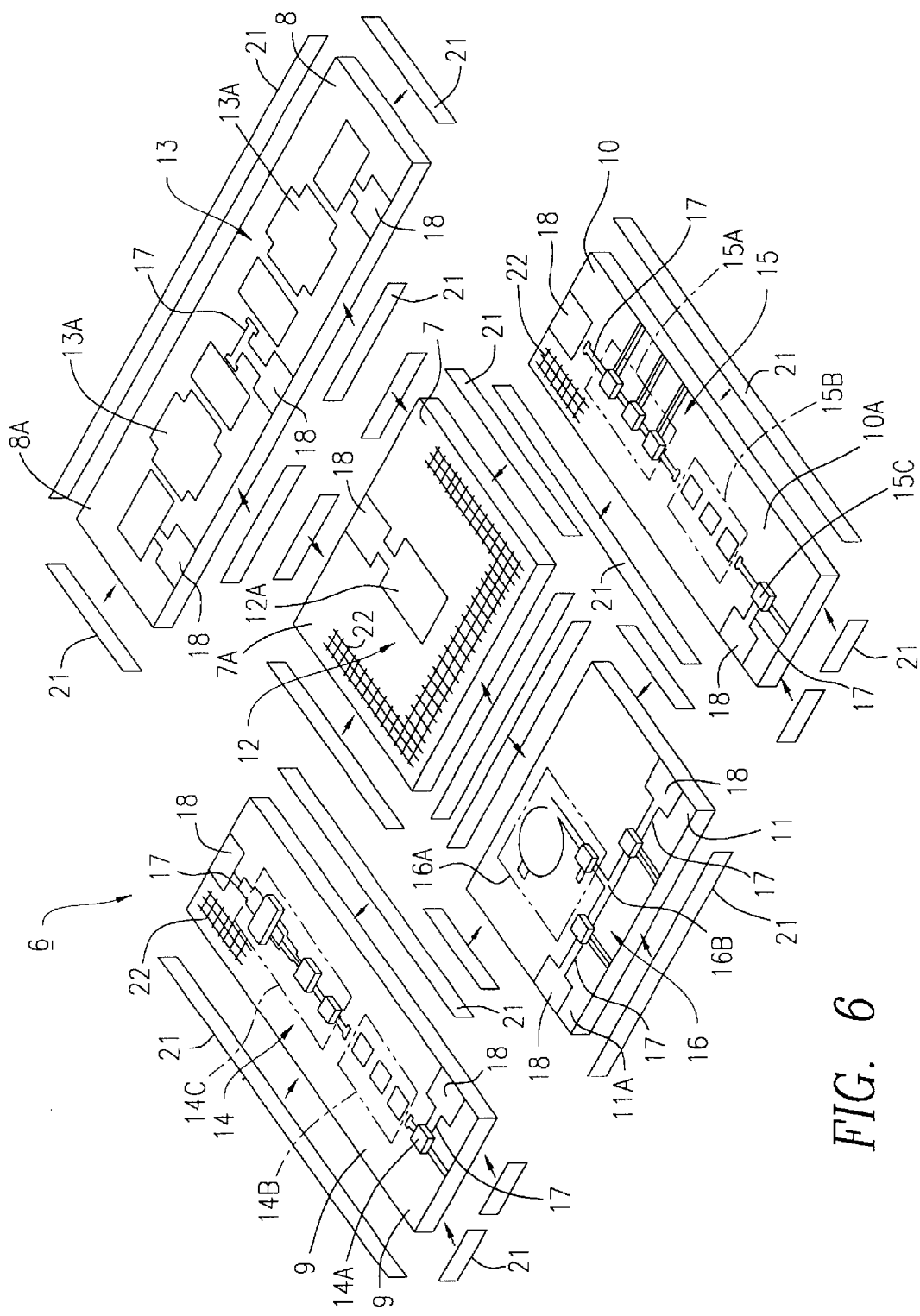
FIG. 6 is an exploded perspective view of a multi-chip substrate according to a second embodiment of the present invention.

FIG. 6 shows a multi-chip substrate of a communication device according to a second embodiment of the present invention. A feature of the second embodiment is that a shielding member for preventing unwanted coupling is provided between two adjacent separate substrates. In the second embodiment, the same reference numerals are given to components corresponding to those in the first embodiment, and descriptions of the common portions are omitted.

Shielding members 21 are provided on edges of the separate substrates 7 to 11, including edges between two adjacent substrates of the separate substrates 7 to 11. The shielding members 21 are formed of, for example, a resin material in which iron powder is mixed, an electromagnetic wave absorption material including carbon, or a shielding metallic material including a highly conductive metallic material such as aluminum. The shielding members 21 can be provided by directly applying or sintering the foregoing materials. Alternatively, the shielding members 21 can be provided by attaching films or sheets to the edges. Although the shielding members 21 are arranged so as to encircle the periphery of the separate substrates 7 to 11, the shielding members 21 are removed at positions where two adjacent ones of the connection resonators 18 of the separate substrates 7 to 11 face each other in order to maintain coupling between the connection resonators 18.

Accordingly, advantages similar to those of the first embodiment can be achieved in the second embodiment. In the second embodiment, the shielding members 21 for preventing unwanted coupling are provided between two adjacent substrates of the separate substrates 7 to 11. It is thus possible to prevent, for example, unwanted waves in a parallel plate mode from coupling with each other between two adjacent substrates of the separate substrates 7 to 11, and hence isolation can be improved. Power loss due to unwanted waves can be suppressed, and higher efficiency can be achieved. Also, noise generated by unwanted waves can be reduced.

When an electromagnetic wave absorption material is used to form the shielding members 21, unwanted waves can be absorbed. Thus, unwanted resonance due to unwanted waves can be prevented, and noise can be reduced.

Alternatively, unwanted-wave suppressing circuits 22 for suppressing unwanted waves can be provided on the conductive films 7A to 11A of the separate substrates 7 to 11.

Figure 7:
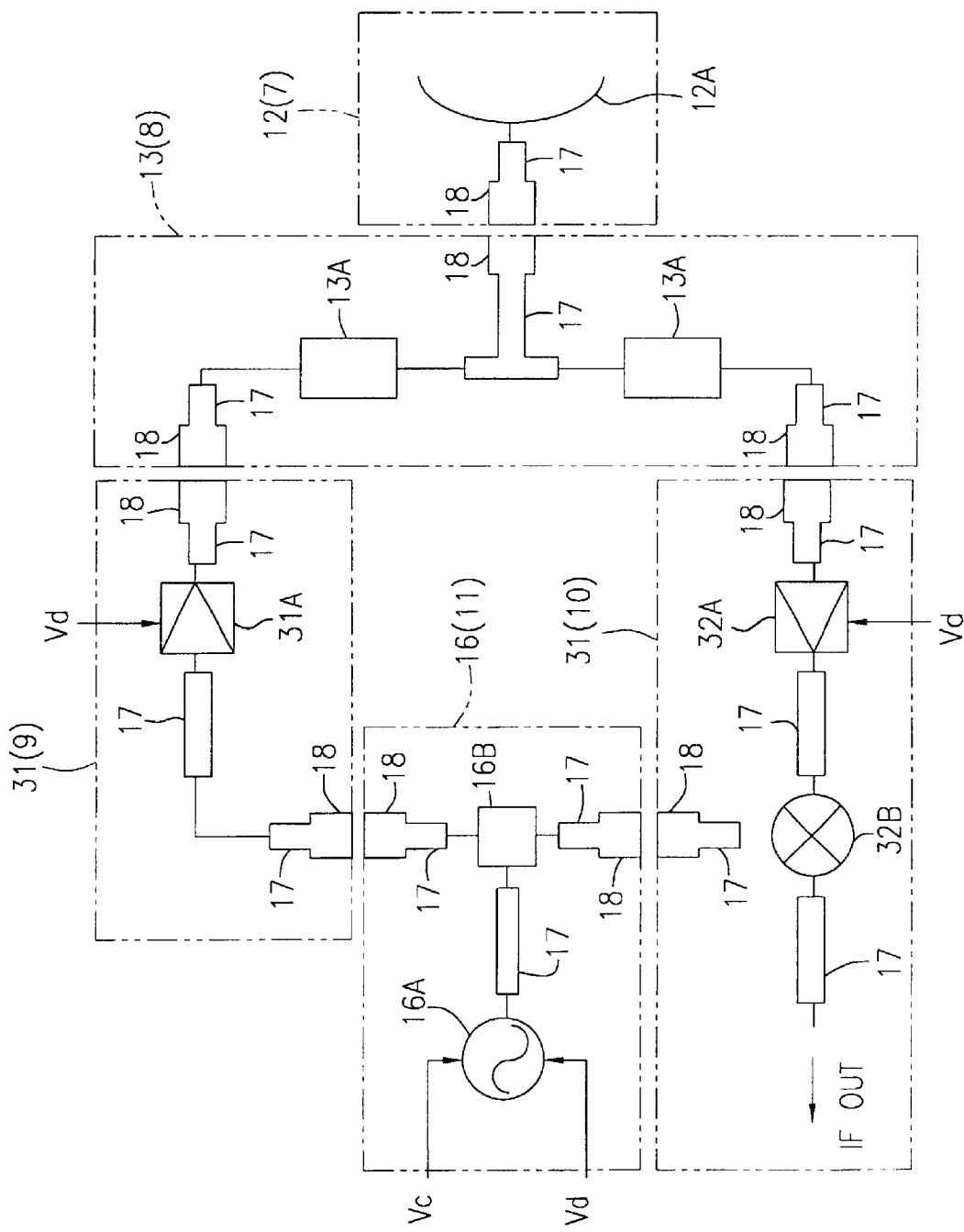
FIG. 7 is a block diagram of the overall configuration of a radar device according to a third embodiment of the present invention.

FIG. 7 shows a radar device, according to an aspect of the present invention, to which an RF module is applied. In FIG. 7, the same reference numerals are given to components corresponding to those in the first embodiment, and descriptions of the common portions are appropriately omitted.

A transmitter block 31 of the radar device is provided on the separate substrate 9 in a manner similar to the transmitter block 14 in the first embodiment. The transmitter block 31 includes a power amplifier 31A formed by electronic components. The output of the power amplifier 31A is connected to the duplexer block 13 via transmission lines 17 and connection resonators 18, and the input of the power amplifier 31A is connected to the oscillator block 16 via transmission lines 17 and connection resonators 18.

A receiver block 32 in the radar device is provided on the separate substrate 10 in a manner similar to the receiver block 15 in the first embodiment. The receiver block 32 includes a low noise amplifier 32A and a mixer 32B, both of which are formed by electronic components. The input of the low noise amplifier 32A is connected to the duplexer block 13 via transmission lines 17 and connection resonators 18. The input of the mixer 32B is connected to the oscillator block 16 via transmission lines 17 and connection resonators 18.

The operation of the radar device will now be described.

When a signal at a predetermined frequency is input to the transmitter block 31 using the oscillator block 16, the transmitter block 31 performs power amplification of the signal and transmits the amplified signal as a transmission signal from the antenna block 12 via the duplexer block 13.

In contrast, when the antenna block 12 receives the reflected wave of the transmission signal, this reception signal is input through the duplexer block 13 to the receiver block 32. By inputting the same signal as the transmission signal from the oscillator block 16 to the receiver block 32, the receiver block 32 mixes the signal output from the oscillator block 16 and the reception signal and downconverts it to the intermediate frequency signal IF.

Accordingly, advantages similar to those in the first embodiment can be achieved in the second embodiment.

Figure 8:
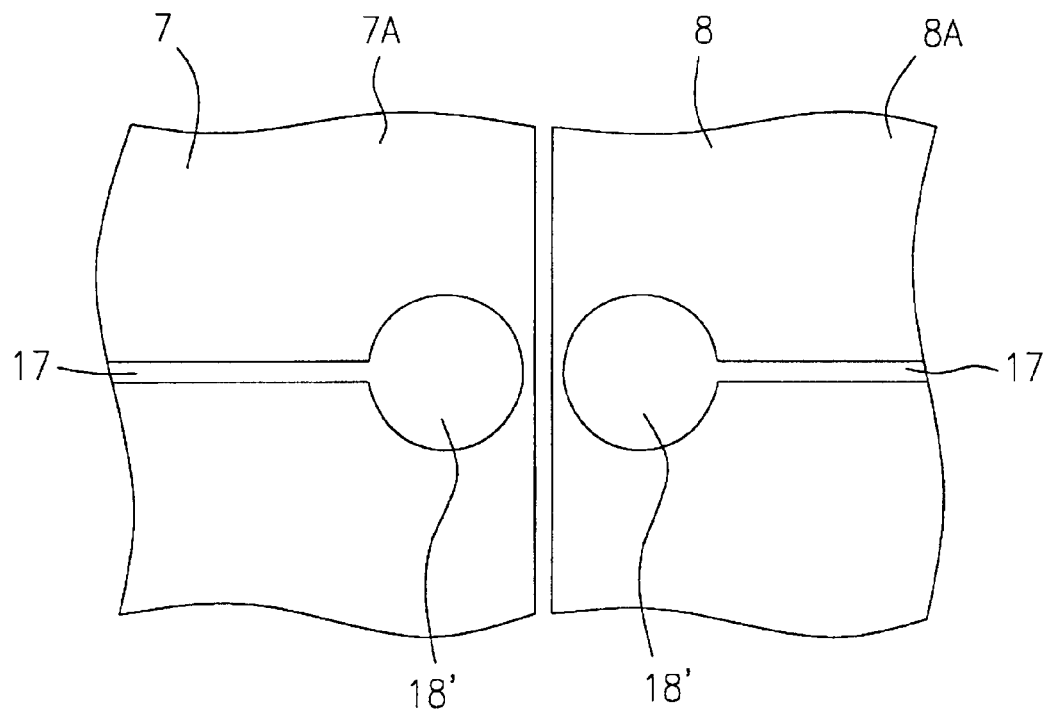
FIG. 8 is a plan view showing connection resonators on separate substrates according to a modification of the present invention.

In the foregoing embodiments, the quadrangular connection resonators 18 whose edges are open are provided on the separate substrates 7 to 11. The adjacent connection resonators 18 are arranged close to each other. Alternatively, as shown in FIG. 8 illustrating a modification, for example, circular connection resonators 18', which are closed at opposing edges, can be provided on the separate substrates 7 and 8. Since the two adjacent connection resonator 18' are only required to be coupled to each other, the adjacent separate substrates 7 and 8 can be in contact with each other or can be at a distance.

Although slot-type lines (slot lines) are used as the transmission lines 17, the present invention is not limited to the slot type. As transmission lines, various types of lines such as a microstrip line, a coplanar guide, a plane dielectric transmission line (PDTL), a finline, a suspended line, and a dielectric line can be used. Also a combination of these various types of lines can be used. Alternatively, as transmission lines, a ground electrode can be provided on substantially the entire back surface of each of the separate substrates 7 to 11, and grounded slot lines can be used.

The connection resonators 18 are not limited to those having quadrangular or circular apertures on the conductive films 7A to 11A. For example, a quadrangular or circular electrode can be provided at the leading end of a microstrip line, and hence a connection resonator can be formed. Concerning a dielectric transmission line, a quadrangular connection resonator formed of a dielectric material can be used.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A radio frequency module comprising:
   a plurality of separate dielectric substrates, each of the plurality of separate dielectric substrates forming separate functional blocks;
   at least one transmission line formed on each of the separate functional blocks, the at least one transmission line of each of the separate functional blocks electrically coupling adjacent ones of the separate functional blocks without the transmission lines contacting each other.

2. The radio frequency module according to claim 1, further comprising a respective resonators electrically coupled to the each of the at least one transmission lines, the respective resonators being provided at edges of the separate functional blocks, each respective resonator electrically coupled to a corresponding resonator on the adjacent separate functional block.

3. The radio frequency module according to claim 2, wherein the respective resonators are wider than the respective transmission line.

4. The radio frequency module according to claim 2, wherein the respective resonators are circular in shape.

5. The radio frequency module according to claim 1, wherein the separate functional blocks comprise:
   an antenna block;
   a duplexer block connected to the antenna block;
   a transmitter block connected to the duplexer block, the transmitter block outputting a transmission signal to the antenna block;
   a receiver block connected to the duplexer block, the receiver block receiving a reception signal received by the antenna block; and
   an oscillator block connected to the transmitter block and the receiver block, the oscillator block oscillating a carrier signal at a predetermined frequency.

6. The radio frequency module according to claim 5, wherein the antenna block includes a parasitic antenna on a package covering the antenna block.

7. The radio frequency module according to claim 1, wherein the plurality of separate dielectric substrates are formed from at least two different types of dielectric materials.

8. The radio frequency module according to claim 1, wherein a shielding member for preventing unwanted coupling of the transmission lines is provided between the adjacent ones of the separate functional blocks.

9. The radio frequency module according to claim 1, wherein the shielding member is a wave suppressing circuit provided on at least one of the adjacent ones of the separate functional blocks.

10. The radio frequency module according to claim 9, wherein the shielding member is not located where the adjacent functional blocks are electrically coupled to each other.

11. The radio frequency module according to claim 1, wherein the separate dielectric substrates are contained in a resin package.

12. The radio frequency module according to claim 11, wherein the resin package is a metalized resin package.

13. The radio frequency module according to claim 1, wherein the transmission lines are formed as at least one of a slot line, a microstrip line, a coplanar guide, a dielectric transmission line, a finline, a suspended line and a grounded slot line.

14. A communication device comprising:

a radio frequency module which includes:

a plurality of separate dielectric substrates, each of the plurality of separate dielectric substrates forming separate functional blocks;

at least one transmission line formed on each of the separate functional blocks, the at least one transmission line of each of the separate functional blocks electrically coupling adjacent ones of the separate functional blocks without the transmission lines contacting each other.

15. A radar device comprising:

a radio frequency module which includes:

a plurality of separate dielectric substrates, each of the plurality of separate dielectric substrates forming separate functional blocks;

at least one transmission line formed on each of the separate functional blocks, the at least one transmission line of each of the separate functional blocks electrically coupling adjacent ones of the separate functional blocks without the transmission lines contacting each other.

* * * * *